United States Patent [19]

Yang et al.

[11] Patent Number: 4,654,295
[45] Date of Patent: Mar. 31, 1987

[54] METHOD OF MAKING SHORT CHANNEL THIN FILM FIELD EFFECT TRANSISTOR

[75] Inventors: Mohshi Yang, Troy; David Vesey, Rochester, both of Mich.

[73] Assignee: Energy Conversion Devices, Inc., Troy, Mich.

[21] Appl. No.: 557,773

[22] Filed: Dec. 5, 1983

[51] Int. Cl.[4] ............................. G03F 7/16; G03F 7/26
[52] U.S. Cl. ...................................... 430/314; 430/313; 430/318
[58] Field of Search ................ 430/313, 314, 315, 318

[56] References Cited

U.S. PATENT DOCUMENTS

| | | | |
|---|---|---|---|
| 3,244,555 | 4/1966 | Adam et al. | 430/314 |
| 3,669,661 | 6/1972 | Page et al. | 430/314 |
| 3,849,136 | 11/1974 | Grebe | 430/314 |
| 4,045,594 | 8/1977 | Maddocks | 430/314 |
| 4,108,717 | 8/1978 | Widmann | 430/314 |
| 4,212,935 | 7/1980 | Canavello et al. | 430/327 |
| 4,265,934 | 5/1981 | Ladd | 430/314 |
| 4,293,624 | 10/1981 | Buckley | 430/314 |
| 4,376,672 | 3/1983 | Wang | 430/313 |
| 4,389,481 | 6/1983 | Poleshuk et al. | 430/311 |
| 4,401,745 | 8/1983 | Nakane et al. | 430/313 |
| 4,409,262 | 10/1983 | Jelks et al. | 427/99 |
| 4,451,554 | 5/1984 | Kishi et al. | 430/313 |

Primary Examiner—Richard L. Schilling
Attorney, Agent, or Firm—Lawrence G. Norris; Richard M. Goldman; Robert S. Nolan

[57] ABSTRACT

Methods for producing field effect transistors having short current-conduction channels and reduced parasitic capacitance are disclosed. The methods allow the channel length to be substantially less than the minimum feature size of the photolithographic mask if desired, thereby enabling very short channel length transistors to be formed using conventional ten micron photolithography. An exemplary method involves: (a) depositing a thick film of photoresist over a multilayered sandwich structure forming part of the transistor, said structure having a bottom gate electrode, an insulator layer thereover, followed by a layer of deposited semiconductor material and a thin film of etchable conductive material thereover; (b) exposing the photoresist through a mask; (c) wetting the photoresist to cause it to swell before development to create an overhang, if desired; (d) etching the etchable material to undercut a portion of the photoresist, and (e) shadow depositing material on top of the uncovered semiconductor layer beyond the shadow of the undercut and overhanging photoresist, thereby locating said channel, and one of the two current-carrying electrodes of the transistor.

15 Claims, 11 Drawing Figures

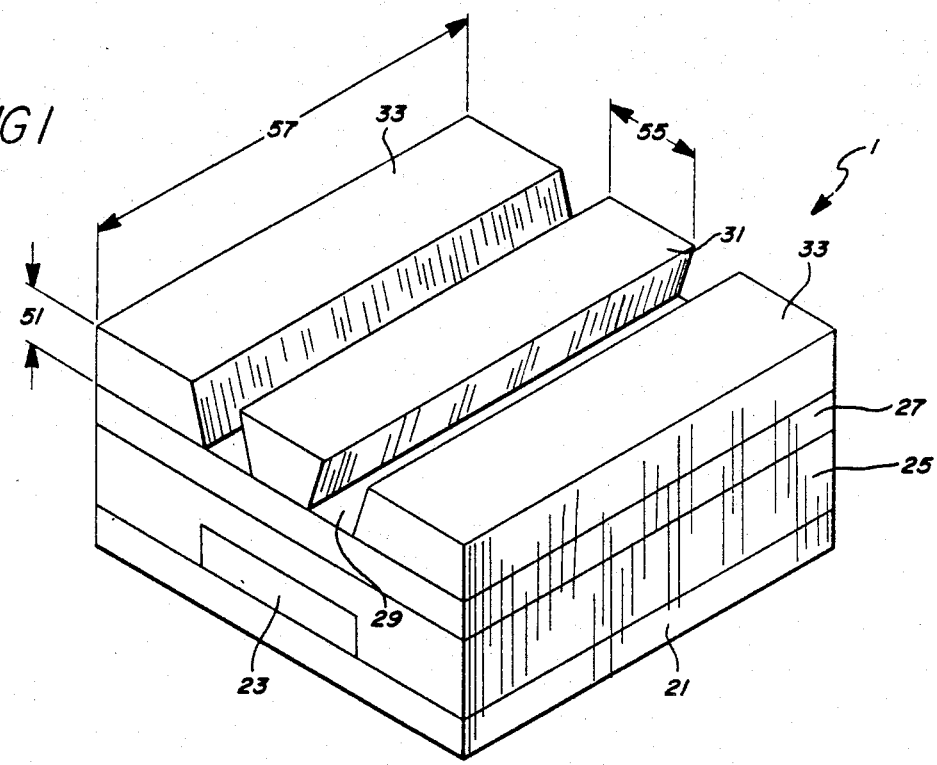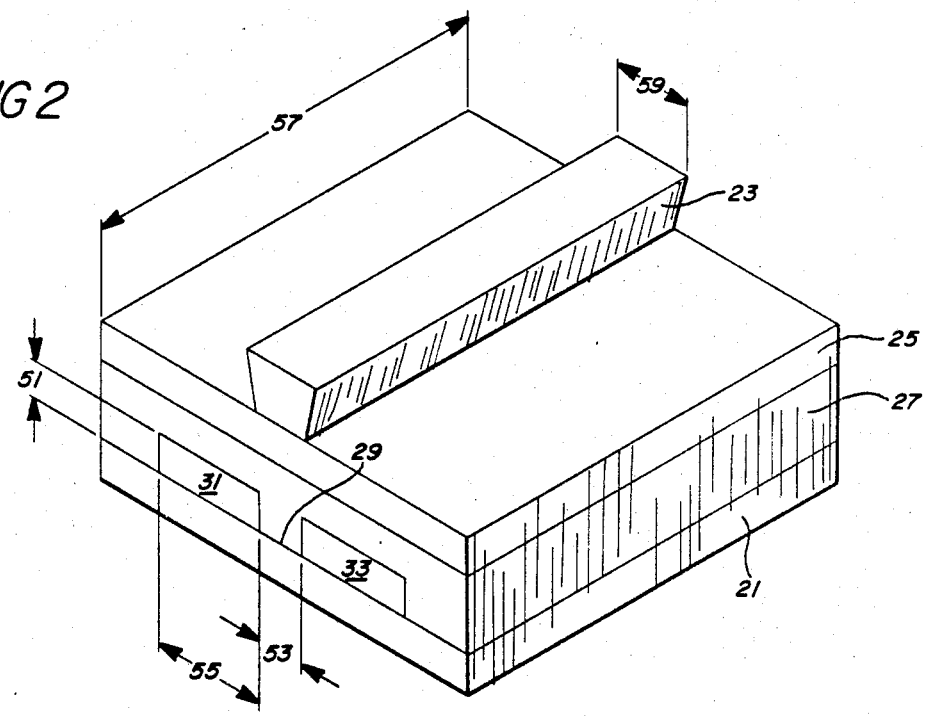

METHOD OF MAKING SHORT CHANNEL THIN FILM FIELD EFFECT TRANSISTOR

FIELD OF INVENTION

The present invention relates to short channel length, thin film field effect transistors. The field effect transistors are characterized by features, e.g., either semiconductor current conducting channels or gate electrodes, or both, having at least one dimension less than the 10 micron photolithographic feature sizes capable of being reliably industrially replicated. The invention also relates to a method of photolithographically forming features having at least one dimension less than those obtained by standard 10 micron industrial photolithographic process.

DESCRIPTION OF THE PRIOR ART

Thin film field effect transistors contain source and drain electrodes electrically in contact with a semiconductor film, and capable of forming a current channel through the semiconductor between the source and drain electrodes under the influence of a gate electrode. The current flow through the current channel in the semiconductor film, between the source electrode and the drain electrode is controlled by the application of a voltage to the gate electrode. The gate electrode is in proximity to the semiconductor current channel but is electrically insulated therefrom. The voltage on the gate electrode produces an electric field which accumulates a charged layer near the semiconductor surface. This charged layer forms the current conducting layer, i.e., the current channel, in the semiconductor.

Thin film field effect transistors capable of high output currents and high speed operations are useful in such diverse applications as large area displays, computer memories, central processing units, and random access memory units.

In thin film field effect transistors, the device output current and the operating speed are dependent on the length of the semiconductor current conduction channel formed between the source electrode and the drain electrode under the influence of the gate electrode. The source to drain output current is inversely proportional to the channel length, while the operating frequency is inversely proportional to the square of the channel length. Thus, when the channel length of the device is reduced by an order of magnitude, for example, from 10 microns to 1 micron, the output current should increase 10 fold and the operating speed or frequency should increase 100 fold.

The operating speed is also dependent on the interelectrode capacitance of the device, larger capacitance causing slower operation. The extension of the gate electrode over the source and drain electrodes is a common source of interelectrode capacitance, and is referred to as overlap parasitic capacitance. The overlap is a result of limited photolithographic resolution.

Large area arrays of multiple thin film field effect transistors may be prepared by standard 10 micron photolithography. When thusly prepared, the minimum channel length which can be achieved in planar thin film transistor arrays is limited by photolithographic feature, typically on the order of 10 microns. One way to overcome the limitations inherent in large area photolithographic resolution is to utilize a vertical structure where channel length is determined by vertical separation of source and drain electrodes, as described and claimed in commonly assigned copending U.S. application Ser. No. 529,299 for *Thin Film Transistor* filed in the names of Richard A. Flasck, et al. The transistor therein disclosed includes source and drain regions vertically displaced with respect to each other relative to a substrate and having a channel formed therebetween. The length of the channel is a function of the vertical displacement distance between the source and drain and is substantially independent of the constraints otherwise imposed by standard 10 micron photolithography.

The aforementioned U.S. application Ser. No. 529,299 of Richard A. Flasck, et al for *Thin Film Transistor* is a continuation of U.S. application Ser. No. 280,378 filed Nov. 19, 1980 for *Thin Film Transistor*, which in turn was a continuation of application Ser. No. 103,011 filed Dec. 13, 1979 for *Deposited Film Memory Systems*.

Further improvement in vertically arrayed thin film field effect transistor structure is described in the commonly assigned copending U.S. application Ser. No. 549,996 of Helmut Fritzsche, et al for *High Performance, Small Area Thin Film Transistor*. The vertical thin film field effect transistor therein disclosed includes source and drain electrodes vertically displaced with respect to each other and relative to the substrate, with an insulating layer therebetween and having a semiconductor current channel extending along the non-coplanar, that is the non-horizontal or diagonal edges of the source and drain electrodes and the insulating layer.

A still further improvement in vertically arrayed thin film field effect transistor structure is described in the commonly assigned copending U.S. application Ser. No. 550,234 of Zvi Yaniv, et al for *High Performance Thin Film Transistor Having Improved Carrier Injection*. The transistor therein disclosed includes the source and drain electrodes vertically displaced with respect to each other relative to a substrate, with a deposited semiconductor extending along the non-coplanar, i.e. non-horizontal or diagonal, edges of the source and drain electrodes, where the contacts between the source and semiconductor and the semiconductor and the drain electrodes have a carrier injection material incorporated therein. A further improvement in thin film field effect transistor structure is described in the commonly assigned copending U.S. application Ser. No. 549,979 of Gregory Hansell, et al for *Thin Film Transistor Having Annealed Gate Oxide And Method Of Making Same*. The transistor there disclosed has an annealed insulator layer between the gate electrode and the semiconductor current channel.

Common to all of the above described field effect transistors is a vertical structure, that is, a structure where the drain is vertically displaced from the source.

SUMMARY OF THE INVENTION

The invention provides a horizontal thin film field effect transistor having either a short current channel in the deposited semiconductor between closely spaced, deposited source and drain electrodes, or minimal gate overlap parasitic capacitance, or both a short channel and minimal gate overlap parasitic capacitance. The improved field effect transistor is characterized by a horizontal structure where the source and drain electrodes are discrete deposits in contact with a semiconductor, and separated from each other by a channel length less then the feature size of industrial photolithographic processes. In a preferred exemplification, the gate electrode is similarly characterized by one horizontal dimension less than the feature size of industrial photolithographic processes. By feature size of industrial photolithographic processes are meant feature sizes that are capable of being reliably and reproducibly obtained in an industrial environment. This is generally about 10 microns.

The invention further provides a method of photolithographically forming a narrow feature device where the smallest dimension of the feature is less then the resolution of industrial photolithographic process. According to the process herein contemplated, a thick film of photoresist is deposited atop a layer of the material to be etched in order to form the feature. The photoresist is exposed and developed and thereafter the underlying material is etched for a time sufficient to undercut the photoresist. According to a further exemplification, the photoresist may be wetted with a suitable solvent whereby to form an inward taper in the photoresist, i.e., an overhang at the top, remote from the material to be etched and an undercut adjacent the material to be etched. The underlying material is then etched, so as to form an undercut therein. In this way, a feature may be prepared having one dimension less than the dimension of the corresponding feature in the photomask. Alternatively, without removal of the remaining photoresist, a facing feature may be shadow deposited with a unidirectional or collimated deposition beam. This avoids the deposition of material within the shadow of the remaining photoresist. In this way, a feature is obtained having one dimension defined by the two deposits, the dimension being less than the dimension of the corresponding feature in the photomask.

The invention provides a method of fabricating a thin film field effect transistor by forming a thick film of photoresist atop a material to be etched, exposing the photoresist through a photomask, developing the photoresist, etching the underlying material to undercut the photomask and form an electrode of one polarity and thereafter, without removal of the remaining photoresist, shadow depositing the opposite electrode. The shadow deposition is carried out from a unidirectional or collimated source. In this way, deposition is avoided within the shadow of the photoresist and first electrode.

The short channel thin film transistor can be formed using a deposited semiconductor, for example an amorphous or polycrystalline semiconductor chosen from the group consisting of silicon, silicon alloys, germanium, and germanium alloys. The gate insulator separates the gate electrode from the semiconductor and may be an electrically insulating oxide. In a preferred exemplification the gate electrode may be formed by depositing a film of conductor, depositing a thick film of photoresist atop the conductor film, exposing and developing the photoresist, and thereafter etching the conductor film so as to undercut the photoresist and form a gate electrode having one dimension less than the corresponding dimension of the photomask. In this way, a device characterized by the substantial absence of overlap parasitic capacitance is formed.

BRIEF DESCRIPTION OF THE FIGURES

FIG. 1 is a isometric view of a thin film field effect transistor of the invention.

FIG. 2 is an isometric view of an alternative thin film field effect transistor of the invention.

DETAILED DESCRIPTION OF THE INVENTION

Figure 3A:
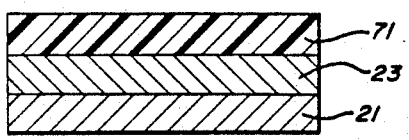
FIGS. 3A through 3I show one method of preparing a transistor of the invention.

According to the invention herein there is provided a planar thin film field effect transistor 1, shown in FIG. 1 and an integrated circuit, not shown. The integrated circuit contains one or more of the field effect transistors 1.

An individual field effect transistor 1 contains a substantially horizontal substrate 21 having a gate electrode 23. A gate insulator layer 25 is in contact with the gate electrode 23, separating the gate electrode 23 from the semiconductor material 27 in which the current channel forms. The semiconductor 27 is a substantially horizonal film of semiconductor material insulated from the gate electrode 23 by the gate insulator 25.

The first electrode 31, for example a source electrode, is on the horizontal film of deposited semiconductor material 27 while a second electrode 33, for example, a drain electrode, is also on the horizontal film of deposited semiconductor material 27. The space between these two electrodes defines a current channel 29 in the deposited semiconductor material 27, between the first electrode 31 and the second electrode 33, the current channel forming under the influence of a potential applied to the gate electrode 23.

The electrodes 31 and 33 typically have a height 51 of from about 0.05 micron to about 1.0 micron and preferably from about 0.1 micron to about 0.3 micron. The first electrode 31, is formed by deposition and etching, and has a width 55 of from about 3 microns to about 9.6 microns.

The channel 29 has a channel length 53, i.e., a minor horizontal dimension, of less then 10 microns and preferably from about 0.2 micron to about 2 microns, where industrial photolithography has a minimum feature size of about 10 microns. The device 1, and more particularly the semiconductor 27 between the two electrodes 31 and 33, has a major horizontal dimension 57 of from about 50 to about 1,000 microns and generally of from about 100 microns to about 500 microns, the exact length being a function of the current to be passed.

Substrate 21 may be an insulator or a conductor with an insulator film thereon. It may further be characterized by having addressing means incorporated therein.

The gate electrode 23, has a thickness of from about 0.05 micron to about 1 micron and preferably from about 0.1 micron to about 0.3 micron. It is most commonly formed of a conductive metal that is chemically compatable with the materials used to form thin film field effect transistor, for example chromium, molybdenum, alloys of molybdenum and tantalum, and aluminum. When subsequent metal, oxide or semiconductor layers are deposited after the gate electrode 23, the gate electrode is preferably formed of chromium, molybdenum, or alloys of molybdenum and tantalum. However, when the gate electrode 23 is the last layer to be deposited, it may be formed of aluminum.

The insulator 25 is generally from about 0.05 micron to about 1 microns thick and preferably from about 0.1 micron to about 0.3 micron thick. The gate insulator 25 may be prepared of silicon oxide as $SiO_x$, a silicon nitride as $Si_xN_y$, a silioxynitride as $SiO_xN_y$, or alumina as $Al_2O_3$. Especially preferred are the silicon oxides and siloxynitrides. When the gate insulator layer 25 is provided by an oxide or oxynitride the gate insulator layer 25 may be prepared by the plasma enhanced chemical vapor deposition of silane and nitrous oxide or silane, ammonia, and nitrous oxide.

The deposited semiconductor layer 27 is from about 0.05 to about 1 micron thick, and preferably from about 0.1 to about 0.3 micron thick. The semiconductor layer 27 may be formed by the plasma assisted chemical vapor deposition of silane, silicon tetrafluoride, and, where required, phosphine, arsine or diborane gases, as described, for example, in U.S. Pat. No. 4,217,374 to S. R. Ovshinsky et al for *Amorphous Semiconductors Equivalent to Crystalline Semiconductors,* and U.S. Pat. No. 4,226,898 to S. R. Ovshinsky et al for *Amorphous Semiconductors Equivalent to Crystalline Semiconductors Produced By A Glow Discharge Process,* the disclosures which are incorporated herein by reference.

The electrodes 31 and 33 are from about 0.05 to about 1 micron thick and preferably from about 0.1 micron to about 0.3 micron thick. They may be highly doped amorphous materials, such as n+ materials deposited by various unidirectional deposition techniques, or they may be metals, whereby to provide the short channel 29 as will be described more fully hereinafter. When the electrodes 31 and 33 are metal electrodes there may be a thin film of n+material, e.g., from 0.05 to about 0.1 micron thick, between the electrodes 31 and 33, and the semiconductor 27.

According to one exemplification, the process of preparing the thin film field effect transistors 1 comprises the steps of forming a thick film of photoresist atop a film of etchable material, e.g., material used to form the gate electrode 23 or to form one of the source 31 and drain 33 electrodes, and exposing the photoresist through relatively coarse resolution exposure means, e.g., a photomask having a minimum feature size of about 10 microns. Thereafter, without excluding intermediate steps, the photoresist is developed and the etchable material is then etched under conditions that result in undercut thereof. The extent of undercut is such as to provide at least one dimension of the remaining etchable material less than the minimum feature size of the photomask. That is, the length 55 of the source 31 or drain 33, or the length 59 of the gate electrode 23 is less than the corresponding feature size 131 of the photomask 101. Thereafter, the photoresist 71 may be removed as where further layers of insulator, semiconductor, or metal, or multiple layers thereof are to be subsequently deposited. Alternatively, the shadow of the photoresist 71 and of the deposited feature, e.g., source electrode 31, may be used to shadow a portion of the underlying material, e.g., semiconductor layer 27, or the substrate 21, during the unidirectional beam deposition of the opposite electrode, e.g., drain electrode 33. In this way, there is provided a thin film, field effect transistor 1 having a source 31 to drain 33 dimension 53 in the semiconductor film 27 less than the minimum feature size 131 of the photomask 101.

In a particularly preferred exemplification where the photoresist 71 is to be used to mask a portion of the underlying, non-etched material, the shadow effect of the photoresist 71 may be enhanced by causing the photoresist to swell between exposure and development. According to this exemplification, the process comprises the steps of forming a thick film of a photoresist 71 atop etchable material, and exposing the photoresist 71 utilizing relatively coarse resolution exposure means. Relatively coarse resolution exposure means are exemplified by photomasks 101 having a minimum feature size 131 of about 10 microns. The photoresist 71 is developed whereby the combination of exposure, swelling, soft-baking and development provides a tapered surface having an overhang in portions of the photoresist 71 remote from the etchable material and an undercut in portions of the photoresist 71 adjacent the etchable material. The etchable material, e.g., conductor 31 in FIG. 3F, is then etched. Thereafter, without removing the remaining photoresist 71, a deposition 33 is shadow deposited atop the subjacent surface, e.g., semiconductor 27 in FIGS. 3A through 3I, facing and spaced from the remaining etchable material 31 and photoresist 71, beyond the shadow of the remaining etchable material 31 and photoresist 71. This forms a channel 29 across the subjacent material 27 between the etchable material 31 and the shadow deposited material 33. The channel 29 is narrower than the feature size 131 of the photomask feature 129.

Figure 3B:
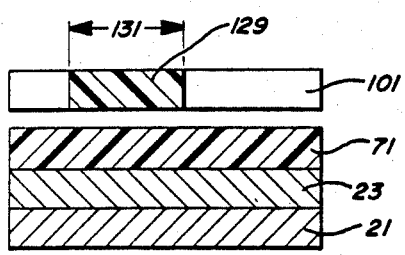
Figure 3C:
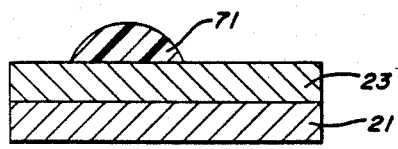
Figure 3D:
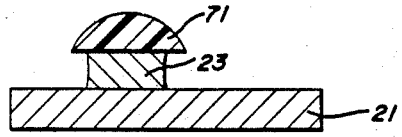
Figure 3E:
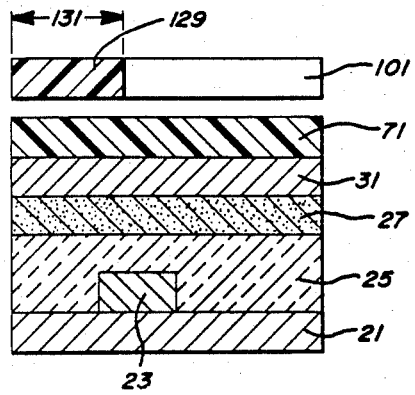
Figure 3F:
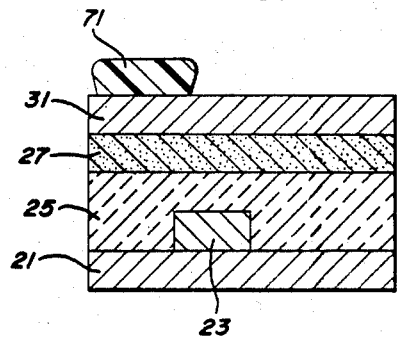
Figure 3G:
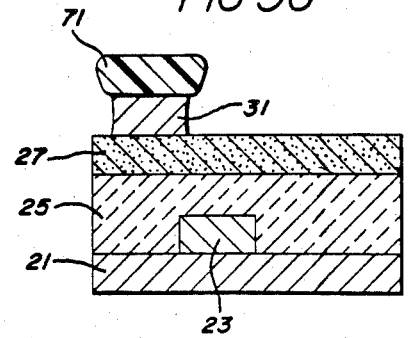
Figure 3H:
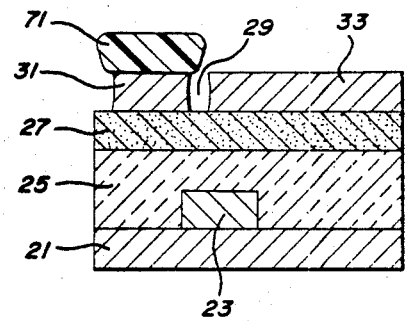
Figure 3I:
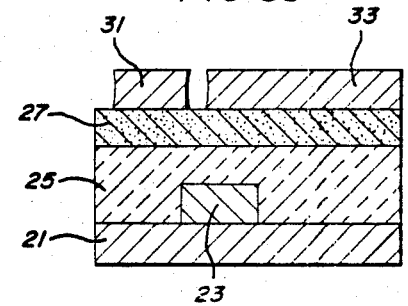

More particularly, the method of the invention may be utilized to fabricate a planar thin film field effect transistor 1 having successive horizontal layers of gate electrode material 23, gate insulator material 25, deposited semiconductor material 27, and deposited conductor material 31 and 33. As herein contemplated and shown in FIGS. 3A through 3F, the fabrication process includes the steps of:

(a) forming a layer of etchable gate electrode material 23 atop an insulative or non-conducting substrate 21 as shown in FIG. 3A;

(b) depositing and soft-baking a thick film of photoresist 71 atop the etchable gate electrode material layer 23 as shown in FIG. 3A;

(c) exposing the thick film of photoresist 71 to light through a photomask 101 having a feature 129 with a feature size 131 greater than the desired size of the corresponding feature to be formed in the etchable gate electrode material 23 as indicated in FIG. 3B;

(d) developing and hardbaking the photoresist as shown in FIG. 3C;

(e) etching the etchable gate electrode material 23 to expose substrate 21 and thereafter over-etching the gate electrode material 23 whereby to undercut the photoresist 71, thereby forming a gate electrode 23 having a dimension less than the dimension 131 of the corresponding feature 129 of the photoresist as shown in FIG. 3D, the resulting gate electrode, having a short length and substantially reduced overlap, provides a device characterized by substantially reduced overlap parasitic capacitance;

(f) removing the photoresist 71, and successively depositing films of gate insulator material 25, semiconductor material 27, optional n+semiconductor material, and etchable source electrode material 31 atop the gate electrode and substrate as shown in FIG. 3E;

(g) depositing and soft-baking a thick film of photoresist 71 atop the thin film of etchable electrode material 31 as shown in FIG. 3E;

(h) exposing the photoresist 71 through a photomask 101 as shown in FIG. 3E;

(i) optionally soft-baking and swelling the photoresist 71, and thereafter developing the photoresist 71 as shown in FIG. 3F;

(j) etching the underlying etchable material 31 whereby to expose n+semiconductor material or semiconductor material 27 and thereafter over-etching the etchable material 31 whereby to form an undercut as shown in FIG. 3G;

(k) without removing photoresist 71, shadow depositing the opposite electrode 33 with unidirectional or collimated metal deposition means whereby to leave a non-metallized portion 29 between the electrodes 31 and 33 as shown in FIG. 3H;

(l) removing the photoresist, and optionally removing the unused portions of the electrodes 33, as shown in FIG. 3I.

According to an alternative exemplification illustrated in FIG. 2, the source 31 and drain electrodes 33 may be formed beneath and before the gate insulator 25 and gate electrode 23, with the gate electrode 23 being above the semiconductor layer 27, and source 31 and drain 33 electrode pairs. According to a still further exemplification the source 31 and drain 33 electrodes may be deposited between the gate insulator 25 and semiconductor 27 layers.

In the alternative exemplification of this invention where one of the source and drain electrode pair 31, 33 is shadow deposited, and where the photoresist is swollen, the photoresist is deposited as a very thick film, soft-baked for about 30 minutes at about 90 degrees centigrade, exposed normally, swollen with an organic solvent, soft-baked again for about 30 minutes at about 90 degrees centigrade, developed normally, hard-baked at about 125 degrees centigrade for about 30 minutes, and the masked material over-etched whereby to produce the undercut.

The organic solvent is most commonly a saturated hydrocarbon, e.g., an aliphatic or aromatic hydrocarbon. Especially preferred are aromatic hydrocarbons. The solvent may be a halogenated, saturated hydrocarbon. Especially preferred are halogenated aromatic hydrocarbons, exemplified by chlorobenzenes, with monochlorobenzene being especially preferred. The solvent wets the photoresist for about 7 to 15 minutes at room temperature.

The action of the solvent forms a tapered surface in the photoresist having an overhang in the portions of the photoresist remote from the conductor and an undercut in the portions of the photoresist adjacent to the conductor. The deposited first conductor is etched whereby to expose portions of the deposited semiconductor 27 and then over-etched to form the undercut. A second conductor is then shadow deposited on to the deposited semiconductor using unidirectional deposition techniques, for example, evaporation or sputtering, whereby to deposit the second conductor on exposed portions of the semiconductor beyond the shadow of the remaining photoresist atop remaining first conductor.

The photoresist may be a positive or negative photoresist. It is deposited to a thickness of from about 0.5 microns to about 5 micron and preferably from about 2 microns to about 4 microns. The photoresist is soft-baked, exposed, developed, and hard-baked normally.

Thus according to a method of this invention a layer of photoresist 71, for example Shipleys positive AZ-1350-J, is deposited. A mask 101 is then placed over a portion of the positive photoresist 71 and the unmasked portion of the photoresist layer 71 is exposed and developed. The unmasked portion is exposed to a light having an intensity of about 300 to about 500 millijoules per square centimeter for a period of approximately 10 to 15 seconds.

Thereafter, the photoresist is hard-baked and developed. A suitable developer has been found to be one part of Shipley developer AZ-311 with three parts of water.

The layer is etched in a wet etching process, for example in nitric acid-acetic acid solution, to provide the undercut. By over-etching is meant that the etch time is longer than that normally utilized to uncover the subjacent material. Typically, the etching time is extended to three to fifty fold relative to the time required to uncover the subjacent material.

Typical etching materials include pawn solution for aluminum, ammonium nitrate-nitric acid for chromium, and other etchants are well known in the art.

For etching chromium, an etchant containing 29.75 grams of ammonium nitrate, 11.2 milliliters of deionized water, and 225 milliliters of dionized water, is used for about 5 to 20 minutes at 20 to 30 degrees centigrade. For aluminum pawn etchant is used at 70 to 80 degrees centigrade for 6 to 10 minutes.

According to one particularly desirable method of this invention an electrode is prepared on a polyimide coated stainless steel substrate where a gate electrode of suitable conducting material, for example chromium, molybdenum-tantalum alloy or aluminum, and preferably chromium, is deposited atop the polyimide film to a thickness of from about 0.05 to about 1 micron and preferably between 0.1 and 0.3 microns. A thick film of photoresist, i.e., from about 2 to about 4 microns thick, is then deposited atop the gate electrode material, exposed and developed, the gate electrode etched to undercut the photoresist, and the photoresist removed. An insulating layer of silicon oxide is thereafter deposited atop the chromium or other gate electrode material, for example by the plasma assisted chemical vapor deposition of silane and oxygen, to a depth of from about 0.05 micron to about 1 micron and preferably from about 0.1 micron to about 0.3 micron.

Thereafter a thin film of an amorphous semiconductor material, for example a semiconductor material containing an alloy of silicon, a density of states reducing material such as fluorine, and hydrogen, is deposited. The amorphous semiconductor material may be deposited by the plasma assisted chemical vapor deposition of silane and fluorosilane. Preferably the film is of a thickness of from about 0.05 micron to about 1 micron and in a preferred exemplification from about 0.1 to about 0.3 micron. Atop the amorphous semiconductor is deposited a relatively uniform film of a metal, for example aluminum or chromium. The metallization may be carried out by the sputtering of chromium or the evaporation of aluminum. The metallized film has a thickness of from about 0.05 micron to about 1 micron preferably from about 0.1 micron to about 0.3 micron.

Etching is then carried out by depositing a photoresist, for example a positive photoresist such as Shipley A7-1350-J to a thickness of from about 2 to 4 microns atop the aluminum or chromium. After exposure and before developing, the photoresist is contacted with a halogenated aromatic hydrocarbon, such as monochlorobenzene, for about 7 to 15 minutes at a temperature of about 20° to 50° C. The photoresist layer is then conventionally developed. The exposed metal is etched. In the case of aluminum, etching is carried out in a solution of 95 milliliters of deionized water, 95 milliliters of nitric acid, 250 milliliters of acetic acid, 1,425 milliliters of phosporic acid, at 45° C. for about 8 minutes whereby to obtain the desired undercut. After etching, and without removing the remaining photoresist, metallization is carried out, for example by evaporative deposition of aluminum or sputtering of chromium. Metallization provides a film of metal of about the same thickness as the original film of etchable material. The photoresist is stripped off as is well known in the art, for example with acetone. Optionally another photoresist film may be applied, to protect the shadow deposit of the second metal, adjacent the channel, while the remote shadow deposited metal is etched to remove unnecessary metal, thereby defining the size of the device.

Subsequently the exposed surface of semiconductor material and electrodes may be metallized, whereby to form address lines.

The length 53 of the channel 29 is believed to be a function of the thickness of the photoresist layer and of the deposited metal layers and of the extent of undercut.

While the invention has been described with respect to certain embodiments and exemplifications thereof it is to be understood that it is not intended to limit the scope of the protection thereby but only by the claims appended hereto.

What we claim is:

1. A method of forming a current conduction channel having a length substantially less than a predetermined minimum feature size in a generally planar, thin film structure, said channel extending from an etchable initially deposited material across a subjacent semiconductor material to a subsequently deposited material, comprising the steps of:
   (a) forming a thick film of photoresist atop the initially deposited etchable material;
   (b) optically exposing the photoresist utilizing relatively coarse resolution exposure means having said predetermined minimum feature size;
   (c) wetting the photoresist with a solvent to cause the photoresist to swell and thereafter developing the photoresist, thereby forming an inwardly tapered surface on the photoresist having an overhang in portions thereof remote from the etchable material;
   (d) etching the initially deposited etchable material sufficiently to uncover subjacent material and to undercut a portion of the photoresist remaining above the etchable material; and
   (e) shadow depositing material atop uncovered subjacent material beyond the shadow of the undercut and overhanging photoresist, thereby forming said channel whose length is substantially equal to the shadow formed by the undercut and overhanging photoresist, and substantially less than said predetermined feature size.

2. The method of claim 1, further comprisng the step of:
   soft-baking the photoresist after the wetting step and before the developing step.

3. The method of claim 1, wherein the photoresist is a positive photoresist, and wherein the thickness of the photoresist film is in the range of about 0.5 micron to about 5 microns.

4. The method of claim 1, wherein the solvent is a halogenated aromatic hydrocarbon.

5. The method of claim 4, wherein the halogenated aromatic hydrocarbon is monochlorobenzene.

6. The method of claim 1 wherein the relatively coarse resolution exposure means is a photomask, and the minimum feature size of the photomask is about ten microns.

7. The method of claim 6 wherein the channel length is in the range from about 0.2 micron to about 2 microns.

8. A method of forming a generally horizontal thin film field effect transistor having deposited source and drain electrodes in contact with a deposited layer of semiconductor material and separated from one another by a current channel in the semiconductor material whose length between the electrodes is smaller than a predetermined minimum feature size, comprising the steps of:
   (a) forming a gate electrode upon a substrate from a first thin film of deposited conductive material;
   (b) depositing a thin film of insulating material atop the gate electrode, thereby forming a gate insulator layer;
   (c) depositing a thin film of non-single-crystals semiconductor material, a portion of which acts as said current channel, atop the film of insulating material;
   (d) depositing a second thin film of conductive material atop to the semiconductor material;
   (e) depositing a thick film of photoresist adjacent the second thin film of conductive material;
   (f) exposing the thick film of photoresist utilizing relatively coarse resolution exposure means having said predetermined minimum feature size; and
   (g) developing the photoresist, thereby defining the general location of one of the source and drain electrodes;
   (h) etching the second thin film of deposited conductive material to uncover the subjacent semiconductor material and to undercut a portion of the photoresist remaining above the general location of said one of the source and drain electrodes; and
   (i) shadow depositing a third thin film of conductive material atop the uncovered semiconductor material beyond the shadow of the undercut, thereby forming said channel having a length substantially less than said peredetermined feature size, and thereby forming at least a portion of the other of the source and drain electrodes.

9. The method of claim 8, wherein the minimum predetermined feature size is about 10 microns, and the length of the current channel is in the range of about 0.2 micron to about 2.0 microns.

10. The method of claim 8, wherein the thickness of the photoresist is in the range from about 0.5 micron to about 5 microns, and the thickness of the second thin film of deposited conductive material is in the range of about 0.05 micron to about 1 micron thick.

11. The method of claim 8 wherein the thickness of the photoresist is the range from about 2 microns to about 4 microns, and the thickness of the second thin film of deposited conductive material is in the range of about 0.1 micron to about 0.3 micron thick.

12. A method of forming a generally horizontal thin film field effect transistor having reduced parasitic capacitance between the gate electrode and one or both of the source and drain electrodes, comprising the steps of:
   (a) forming horizontally spaced apart thin film source and drain electrodes atop an insulating substrate, said source and drain electrodes being separated by a distance substantially equal to the minimum feature size of the photomask used to pattern at least one of the source and drain electrodes;
   (b) depositing a thin film of non-single-crystal semiconductor material atop and in contact with the source and drain electrodes, thereby forming a current channel therebetween;

(c) depositing a thin film of insulating material atop the semiconductor material;

(d) depositing a thin film of etchable conductive material atop the deposited insulating material;

(e) forming a thick film of photoresist atop the deposited etchable conductive material;

(f) exposing the photresist through a relatively coarse resolution exposure means having said minimum predetermined feature size to define the general location of a gate electrode substantially directly above the current channel between the source and drain electrodes;

(g) developing the photoresist; and (h) etching the etchable conductive material to uncover the subjacent insulating material and to undercut a portion of the photoresist remaining above the general location of the gate electrode, thereby defining a gate electrode having at least one dimension less than the minimum feature size of the exposure means, said dimension also being less than the length of the current channel between the source and drain electrodes, whereby parasitic capacitance between the gate electrode and at one of the source and drain electrodes due to overlap is minimized.

13. The method of claim 12 wherein the etchable conductive material forming the gate electrode is overetched by at least threefold relative to the time required to uncover the insulating material therebelow.

14. The method of claim 12 wherein the exposure means has a minimum feature at least equal to about ten microns, and said one dimension of the gate electrode is less than ten microns.

15. The method of claim 12 wherein the thickness of the deposited layer of conductive material forming the gate electrode is in the range of about 0.05 to about 0.3 micron.

* * * * *